(12) United States Patent
Magness

(10) Patent No.: US 11,296,481 B2
(45) Date of Patent: Apr. 5, 2022

(54) DIVERGENCE RESHAPING ARRAY

(71) Applicant: LEONARDO ELECTRONICS US INC., Tucson, AZ (US)

(72) Inventor: Connor L. Magness, Tucson, AZ (US)

(73) Assignee: LEONARDO ELECTRONICS US INC., Tucson, AZ (US)

( * ) Notice: Subject to any disclaimer, the term of this patent is extended or adjusted under 35 U.S.C. 154(b) by 239 days.

(21) Appl. No.: 16/734,133

(22) Filed: Jan. 3, 2020

(65) Prior Publication Data

US 2020/0220321 A1 Jul. 9, 2020

Related U.S. Application Data

(60) Provisional application No. 62/790,193, filed on Jan. 9, 2019.

(51) Int. Cl.
| | |
|---|---|
| G02B 27/10 | (2006.01) |
| H01S 5/02326 | (2021.01) |
| G02B 27/30 | (2006.01) |
| G02B 27/09 | (2006.01) |

(52) U.S. Cl.
CPC .......... *H01S 5/02326* (2021.01); *G02B 27/30* (2013.01); *G02B 27/0961* (2013.01)

(58) Field of Classification Search
CPC ... H01S 5/4012; H01S 5/005; G02B 19/0057; G02B 19/0014; G02B 27/0966; G02B 19/0028; G02B 27/0905; G02B 27/0961; G02B 27/30; G02B 19/0052
USPC .......................................................... 359/618
See application file for complete search history.

(56) References Cited

U.S. PATENT DOCUMENTS

| | | | |
|---|---|---|---|
| 3,711,939 A | 1/1973 | Stoll | 228/246 |
| 3,805,375 A | 4/1974 | LaCombe et al. | 29/832 |
| 3,936,322 A | 2/1976 | Blum et al. | 148/1.5 |
| 4,092,614 A | 5/1978 | Sakuma et al. | |
| 4,156,879 A | 5/1979 | Lee | 357/22 |

(Continued)

FOREIGN PATENT DOCUMENTS

| | | |
|---|---|---|
| CA | 2 208 370 C | 7/2005 |
| DE | 968430 | 2/1958 |

(Continued)

OTHER PUBLICATIONS

European Search Report issued in related European Patent Application Serial No. 20150730.8, dated Jul. 3, 2020 (9 pages).

(Continued)

*Primary Examiner* — James C. Jones
(74) *Attorney, Agent, or Firm* — Hayes Soloway P.C.

(57) ABSTRACT

A divergence reshaping apparatus for laser diodes having a fast axis and a slow axis includes a fast axis collimator element having positive optical power in the fast axis and no optical power in the slow axis. A slow axis magnifier element has no optical power in the fast axis and positive optical power in the slow axis. An objective element has positive optical power in the fast axis and no optical power in the slow axis. A slow axis collimator element has negative optical power in the fast axis and positive optical power in the slow axis. Every element is optically aligned down an optical axis, and wherein a beam traveling through every element is collimated, compressed and shifted in the fast axis and expanded and collimated in the slow axis.

20 Claims, 7 Drawing Sheets

(56) References Cited

U.S. PATENT DOCUMENTS

| | | | |
|---|---|---|---|
| 4,306,278 A | 12/1981 | Fulton et al. ................ 362/259 |
| 4,653,056 A | 3/1987 | Baer et al. |
| 4,767,674 A | 8/1988 | Shirai .................. 257/E23.006 |
| 4,803,691 A | 2/1989 | Scifres et al. ................ 372/150 |
| 4,813,762 A | 3/1989 | Leger |
| 4,881,237 A | 11/1989 | Donnelly |
| 4,903,274 A | 2/1990 | Taney et al. |
| 4,947,401 A | 8/1990 | Hinata et al. |
| 4,980,893 A | 12/1990 | Thornton et al. |
| 4,993,148 A | 2/1991 | Adachi ........................ 174/252 |
| 5,008,737 A | 4/1991 | Burnham et al. ................ 357/81 |
| 5,031,187 A | 7/1991 | Orenstein et al. |
| 5,040,187 A | 8/1991 | Karpinski |
| 5,045,972 A | 9/1991 | Supan ..................... C22C 26/00 |
| 5,060,237 A | 10/1991 | Peterson |
| 5,061,974 A | 10/1991 | Onodera et al. |
| 5,099,488 A | 3/1992 | Ahrabi et al. |
| 5,102,825 A | 4/1992 | Brennan et al. ............... 437/129 |
| 5,105,429 A | 4/1992 | Mundinger et al. |
| 5,105,430 A | 4/1992 | Mundinger et al. |
| 5,128,951 A | 7/1992 | Karpinski |
| 5,202,706 A | 4/1993 | Hasegawa ..................... 359/819 |
| 5,212,706 A | 5/1993 | Jain |
| 5,212,707 A | 5/1993 | Heidel et al. |
| 5,253,260 A | 10/1993 | Palombo ........................ 372/34 |
| 5,284,790 A | 2/1994 | Karpinski |
| 5,298,762 A | 3/1994 | Ou .............................. 257/13 |
| 5,305,344 A | 4/1994 | Patel |
| 5,311,530 A | 5/1994 | Wagner et al. ................. 372/36 |
| 5,311,535 A | 5/1994 | Karpinski |
| 5,325,384 A | 6/1994 | Herb et al. |
| 5,394,426 A | 2/1995 | Joslin |
| 5,418,799 A | 5/1995 | Tada |
| 5,440,577 A | 8/1995 | Tucker |
| 5,450,430 A | 9/1995 | Chang ............................ 372/38 |
| 5,455,738 A | 10/1995 | Montesano et al. .......... 361/707 |
| 5,497,391 A | 3/1996 | Paoli |
| 5,504,767 A | 4/1996 | Jamison et al. |
| 5,521,931 A | 5/1996 | Biegelsen et al. .............. 372/36 |
| 5,526,373 A | 6/1996 | Karpinski |
| 5,568,498 A | 10/1996 | Nilsson |
| 5,593,815 A | 1/1997 | Ahn ............................ 430/321 |
| 5,627,850 A | 5/1997 | Irwin et al. |
| 5,644,586 A | 7/1997 | Kawano et al. |
| 5,679,963 A | 10/1997 | Klem et al. ..................... 257/46 |
| 5,764,675 A | 6/1998 | Juhala |
| 5,778,020 A | 7/1998 | Gokay |
| 5,783,316 A | 7/1998 | Colella et al. |
| 5,812,573 A | 9/1998 | Shiomi et al. |
| 5,835,515 A | 11/1998 | Huang et al. |
| 5,835,518 A | 11/1998 | Mundinger et al. ............. 372/50 |
| 5,848,083 A | 12/1998 | Haden et al. ................... 372/36 |
| 5,856,990 A | 1/1999 | Nilsson ......................... 359/344 |
| 5,909,458 A | 6/1999 | Freitas et al. ................... 372/36 |
| 5,913,108 A | 6/1999 | Stephens et al. |
| 5,923,692 A | 7/1999 | Staskus et al. |
| 5,930,279 A | 7/1999 | Apollonov et al. ............. 372/50 |
| 5,987,045 A | 11/1999 | Albares ........................... 372/38 |
| 6,031,285 A | 2/2000 | Nishibayashi |
| 6,101,208 A | 8/2000 | Gokay |
| 6,208,677 B1 | 3/2001 | Moyer ............................ 372/66 |
| 6,252,179 B1 | 6/2001 | Lauffer ......................... 174/255 |
| 6,281,471 B1 | 8/2001 | Smart ....................... 219/121.62 |
| 6,295,307 B1 | 9/2001 | Hoden et al. .................. 372/36 |
| 6,352,873 B1 | 3/2002 | Hoden .......................... 438/28 |
| 6,396,857 B1 | 5/2002 | Labranche |
| 6,424,667 B1 | 7/2002 | Endriz et al. |
| 6,480,514 B1 | 11/2002 | Lorenzen et al. ............... 372/35 |
| 6,493,373 B1 | 12/2002 | Boucart .................... 257/33.069 |
| 6,535,533 B2 | 3/2003 | Lorenzen et al. ............... 372/34 |
| 6,535,541 B1 | 3/2003 | Boucart et al. ................. 372/96 |
| 6,542,531 B2 | 4/2003 | Sirbu ..................... B82Y 20/00 |
| 6,727,117 B1 | 4/2004 | McCoy |
| 6,865,200 B2 | 3/2005 | Takigawa et al. |
| 7,016,383 B2 | 3/2006 | Rice |
| 7,286,359 B2 | 10/2007 | Khbeis et al. |
| 7,359,413 B2 | 4/2008 | Tzuk et al. ...................... 372/34 |
| 7,529,286 B2 | 5/2009 | Gokay et al. ................... 372/69 |
| 7,580,189 B2 | 8/2009 | Urey |
| 7,660,335 B2 | 2/2010 | Thiagarajan et al. .......... 372/34 |
| 7,864,825 B2 | 1/2011 | Thiagarajan et al. .......... 372/36 |
| 7,944,955 B2 | 5/2011 | Thiagarajan et al. .......... 372/34 |
| 8,017,935 B2 | 9/2011 | Staszewski et al. ............ 257/27 |
| 8,653,550 B2 | 2/2014 | Mastro .................... H01L 33/40 |
| 8,664,524 B2 | 3/2014 | Gamett ............ H01L 31/02966 |
| 8,848,753 B2 | 9/2014 | Koenning ................ 372/29.021 |
| 9,256,073 B2 | 2/2016 | Chann |
| 10,120,149 B1 | 11/2018 | Mathai ................... G02B 6/425 |
| 2001/0017870 A1 | 8/2001 | Hayakawa ...................... 372/40 |
| 2002/0001864 A1 | 1/2002 | Ishikawa et al. |
| 2002/0009106 A1 | 1/2002 | Miyokawa et al. |
| 2002/0014631 A1 | 2/2002 | Iwata .............................. 257/89 |
| 2002/0025096 A1 | 2/2002 | Wang et al. ...................... 385/8 |
| 2002/0086483 A1 | 7/2002 | Kim .............................. 438/264 |
| 2002/0086486 A1 | 7/2002 | Tanaka ............. H01L 21/28518 |
| 2003/0116767 A1 | 6/2003 | Kneissl et al. .................. 257/79 |
| 2004/0037340 A1 | 2/2004 | Yanagisawa |
| 2004/0052280 A1 | 3/2004 | Rice |
| 2004/0082112 A1 | 4/2004 | Stephens |
| 2004/0125459 A1 | 7/2004 | Tanitsu et al. ................ 359/619 |
| 2004/0264521 A1 | 12/2004 | Ness et al. |
| 2005/0095755 A1 | 5/2005 | Nakata et al. |
| 2005/0232628 A1 | 10/2005 | Hold et al. ...................... 398/41 |
| 2005/0254539 A1 | 11/2005 | Klimek |
| 2006/0011938 A1 | 1/2006 | Debray ........................ 257/104 |
| 2006/0197100 A1 | 9/2006 | Shen ............................... 257/94 |
| 2007/0116079 A1 | 5/2007 | Giniunas et al. ............... 372/69 |
| 2007/0273957 A1 | 11/2007 | Zalevsky ........... G02B 27/1093 |
| 2008/0089380 A1 | 4/2008 | Konig et al. .................... 372/75 |
| 2008/0123710 A1 | 5/2008 | Brick ...................... B82Y 20/00 |
| 2008/0130223 A1 | 6/2008 | Nakamura ............ H02M 7/003 |
| 2008/0213710 A1 | 9/2008 | Schultz ................... F23N 1/027 |
| 2008/0259983 A1 | 10/2008 | Trococoli .......................... 372/6 |
| 2009/0015185 A1 | 1/2009 | Yoshida ........................ 318/504 |
| 2009/0090932 A1 | 4/2009 | Bour et al. .................... 257/103 |
| 2010/0012188 A1 | 1/2010 | Garnett ......................... 136/260 |
| 2011/0051759 A1 | 3/2011 | Telford .......................... 372/35 |
| 2011/0103409 A1 | 5/2011 | Sipes ....................... G02B 6/4296 |
| 2011/0241549 A1 | 10/2011 | Wootton ....................... 315/117 |
| 2011/0280269 A1 | 11/2011 | Ghang-Hasnain ....... H01S 5/105 |
| 2012/0114001 A1 | 5/2012 | Fang et al. ................. 372/45.01 |
| 2012/0153254 A1 | 6/2012 | Mastro ........................... 257/13 |
| 2012/0252144 A1 | 10/2012 | Schroeder et al. ............. 438/26 |
| 2012/0287958 A1 | 11/2012 | Lell .......................... H01S 5/323 |
| 2013/0016752 A1 | 1/2013 | Lell .......................... H01S 5/323 |
| 2013/0112667 A1 | 5/2013 | Holmgren |
| 2013/0259074 A1 | 10/2013 | Newman .................... H01S 3/04 |
| 2013/0271959 A1 | 10/2013 | Woodgate ................ G09F 13/04 |
| 2014/0293554 A1 | 10/2014 | Shashkov ...................... 361/748 |
| 2015/0063387 A1 | 3/2015 | Joseph et al. ........ H01S 5/02438 |
| 2015/0162478 A1 | 6/2015 | Fafard .......................... 257/461 |
| 2015/0207011 A1 | 7/2015 | Gamett ................ H01L 31/0368 |
| 2015/0207294 A1 | 7/2015 | Brick et al. ................. H01S 5/10 |
| 2015/0255960 A1 | 9/2015 | Kanskar .................... H01S 5/4075 |
| 2016/0014878 A1 | 1/2016 | Kilkenny ........................ 257/99 |
| 2016/0147025 A1* | 5/2016 | Sakamoto .......... G02B 27/0905 |
| | | 385/33 |
| 2017/0051884 A1 | 2/2017 | Raring |
| 2017/0288367 A1 | 10/2017 | Tanigucki |
| 2017/0338194 A1 | 11/2017 | Gittemeier |
| 2018/0152000 A1 | 5/2018 | Crawford et al. .. H01S 5/02288 |
| 2018/0254606 A1 | 9/2018 | McElhinney et al. ........................ H01S 5/02484 |
| 2018/0261975 A1 | 9/2018 | Pavlov |
| 2018/0335582 A1 | 11/2018 | Iskige |
| 2018/0337513 A1 | 11/2018 | Crawford et al. .... H01S 5/3095 |
| 2020/0027839 A1 | 1/2020 | Hino ..................... H01L 23/49 |
| 2020/0028332 A1 | 1/2020 | Kobayashi |
| 2020/0075529 A1 | 3/2020 | Otsuka |

FOREIGN PATENT DOCUMENTS

| | | | |
|---|---|---|---|
| DE | 19518177 | 11/1996 | .......... H01S 3/0941 |
| DE | 10062579 | 6/2001 | |

(56) References Cited

FOREIGN PATENT DOCUMENTS

| DE | 102008040374 | 1/2010 | ............... H01S 5/40 |
|---|---|---|---|
| EP | 1439618 | 7/2004 | ............. H01S 5/024 |
| EP | 1452614 | 9/2004 | ............. H01S 5/024 |
| EP | 1811617 | 7/2007 | ............. H01S 5/024 |
| EP | 1887666 | 2/2008 | ............. H01S 5/024 |
| EP | 2110903 | 10/2009 | ............... H01S 5/00 |
| EP | 2305400 | 4/2011 | ............. B22D 19/00 |
| JP | 2002111058 | 4/2002 | ............. H01L 33/00 |

OTHER PUBLICATIONS

U.S. Appl. No. 16/539,889, filed Aug. 13, 2019, Ruben et al.
U.S. Appl. No. 16/540,961, filed Aug. 14, 2019, Helmrich et al.
Chinese Official Action issued in related Chinese Patent Application Serial No. 201780073945.8, dated Sep. 21, 2020 (16 pages) with translation.
Official Action issued in Applicants' corresponding EPO Application Serial No. 07117048.7-2222, dated Aug. 6, 2009, 4 pages.
Official Action issued in Applicants' corresponding EPO Application Serial No. 07117048.7-2222, dated Nov. 20, 2008, 9 pages.
Intention to Grant issued in Applicants' corresponding EPO Application Serial No. 09157643.9, dated Apr. 7, 2017, 6 pages.
Official Action issued in Applicants' corresponding EPO Application Serial No. 09157643.9, dated Aug. 22, 2016, 5 pages.
Official Action issued in Applicants' corresponding EPO Application No. 09157643.9, dated Apr. 16, 2014, 2 pages.
European Search Report issued in application No. 09157643.9, dated Aug. 9, 2013 (7 pgs).
European Search Report issued in application No. 20150730.8, dated Jul. 3, 2020 (8 pgs).
Intention to Grant issued in Applicants' corresponding EPO Application Serial No. 16172620.3, dated Jul. 19, 2019, 3 pages.
European Search Report issued in application No. 18173282.7-1211, dated Oct. 8, 2018 (8 pgs).
Intention to Grant issued in Applicants' corresponding EPO Application Serial No. 06845311.7, dated Nov. 9, 2010, 5 pages.
European Search Report issued in application No. 06845311.7, dated Mar. 31, 2010 (9 pgs).
Official Action issued in European application No. 18173282.7-1211, dated Jan. 23, 2020 (6 pgs).
European Search Report issued in application No. 16172620.3, dated Oct. 25, 2016 (9 pgs).
European Search Report issued in application No. 20150730.8, dated Jul. 3, 2020 (9 pages).
European Supplemental Search Report issued in related European Patent Application 17875888.4, dated Jul. 9, 2020 (11 pages).
Feng, et al., "High efficient GaN-based laster diodes with tunnel junction", Applied Physics Letters 103, AIP Publishing, LLC, 2013.
Rieprich, et al., "Proceedings of SPIE—Assessment of factors regulating the thermal lens profile and lateral brightness in high power diode lasers", SPIEL ASE, 2017.
Office Action issued in U.S. Appl. No. 15/363,874, dated Jul. 18, 2019 (24 pgs).
Office Action issued in U.S. Appl. No. 15/363,874, dated Apr. 24, 2018 (10 pgs).
Office Action issued in U.S. Appl. No. 15/363,874, dated Feb. 14, 2019 (13 pgs).
Office Action issued in U.S. Appl. No. 15/363,874, dated Mar. 6, 2020 (12 pgs).
Office Action issued in U.S. Appl. No. 15/363,874, dated Jun. 15, 2020 (12 pgs).
Office Action issued in U.S. Appl. No. 15/363,874, dated Oct. 14, 2020 (11 pgs).
Office Action issued in U.S. Appl. No. 15/363,874, dated Oct. 4, 2018 (14 pgs).
Notice of Allowance issued in U.S. Appl. No. 15/363,874, dated Feb. 2, 2021 (7 pgs).
Office Action issued in U.S. Appl. No. 14/728,923, dated Aug. 9, 2018 (17 pgs).
Office Action issued in U.S. Appl. No. 14/728,923, dated Apr. 19, 2018 (16 pgs).
Office Action issued in U.S. Appl. No. 14/728,923, dated Oct. 2, 2017 (11 pgs).
Office Action issued in U.S. Appl. No. 12/105,126, dated Jul. 23, 2009 (7 pgs).
Office Action issued in U.S. Appl. No. 12/105,126, dated Apr. 24, 2009 (8 pgs).
Notice of Allowance issued in U.S. Appl. No. 12/105,126, dated Sep. 22, 2009 (7 pgs).
Notice of Allowance issued in U.S. Appl. No. 12/648,141, dated Jan. 11, 2011 (11 pgs).
Office Action issued in U.S. Appl. No. 16/539,889, dated Feb. 1, 2021 (18 pgs).
Office Action issued in U.S. Appl. No. 16/539,889, dated Oct. 21, 2020 (16 pgs).
Office Action issued in U.S. Appl. No. 16/539,889, dated Jul. 1, 2020 (19 pgs).
Office Action issued in U.S. Appl. No. 11/299,029, dated Aug. 22, 2008 (8 pgs).
Office Action issued in U.S. Appl. No. 16/540,961, dated Nov. 17, 2020 (13 pgs).
Office Action issued in U.S. Appl. No. 16/540,961, dated Aug. 5, 2020 (9 pgs).
Office Action issued in U.S. Appl. No. 11/829,030, dated Nov. 30, 2009 (16 pgs).
Office Action issued in U.S. Appl. No. 11/829,030, dated Jun. 24, 2009 (13 pgs).
Office Action issued in U.S. Appl. No. 11/829,030, dated Apr. 3, 2009 (13 pgs).
Office Action issued in U.S. Appl. No. 11/829,030, dated Nov. 12, 2008 (12 pgs).
Notice of Allowance issued in U.S. Appl. No. 11/829,030, dated Aug. 30, 2010 (7 pgs).
Giri et al, "Influence of Hot Electron Scattering and Electron-Phonon Interactions on Thermal Boundary Conductance at Metal/Nonmetal Interfaces" Journal of Heat Transfer, vol. 136, dated Sep. 2014 (6 pgs).
Martin et al., "Thermal Behavior of Visible AlGaInP—GaInP Ridge Laser Diodes" IEEE Journal of Quantum Electronics, vol. 28, No. 11, dated Nov. 1992 (7 pgs).
Monachon, C., "Thermal Boundary Conductance Between Metals and Dielectrics" thesis for the graduation of Doctor of Science, Federal Institute of Technology in Lausanne, 2013 (251 pgs).
Nekorkin et al., "Nonlinear mode mixing in dual-wavelength semiconductor lasers with tunnel junctions", Applied Physics Letters 90, 171106 (2007) (3 pgs).
Notice of Allowance issued in U.S. Appl. No. 15/601,820, dated Jun. 11, 2019 (8 pgs).
Rieprich et al., "Assessment of Factors Regulating the Thermal Lens Profile and Lateral Brightness in High Power Diode Lasers" Proc of SPIE, vol. 10085, No. 1008502-1, dated 2017 (10 pgs).
Zhang et al., "Thermal Transport Across Metal-Insulator Interface via Electron-Phonon Interaction," Journal of Physics Condensed Matter, dated Oct. 2013 (15 pgs).
International Preliminary Report on Patentability issued in application No. PCT/US2017/057209, dated Jun. 4, 2019 (8 pgs).
International Search Report and Written Opinion issued in corresponding PCT Patent Appln. No. PCT/US17/57209 dated Jan. 16, 2018, 10 pgs.
International Search Report and Written Opinion issued in corresponding PCT Patent Appln. No. PCT/US19/46410 dated Nov. 8, 2019, 7 pgs.
Office Action issued in U.S. Appl. No. 15/601,820, dated Feb. 27, 2019 (26 pages).
Office Action issued in U.S. Appl. No. 15/601,820, dated Aug. 27, 2018 (28 pages).
Yonkee, B.P., et al., "Demonstration of a III-nitride edge-emitting laser diode utilizing a GaN tunnel junction contact", Optics Express, vol. 24, No. 7, pp. 7816-7822, Apr. 2016.

(56) References Cited

OTHER PUBLICATIONS

Young, Lee W., Authorized officer, International Searching Authority, Written Opinion of the International Searching Authority, International Patent Application Serial No. PCT/US06/47448, completion date: Oct. 30, 2008.
Young, Lee W., Authorized officer, International Searching Authority, International Search Report, International Patent Application Serial No. PCT/US06/47448, search date: Nov. 1, 2008.
Polyimide properties data sheet, www.mit.edu, Oct. 27, 2004 (Year 2004).
RO30000 Series Laminates, Rogers Corporation Data sheet (year 2020).
Sunstone, FR-4 PCB Material, Mar. 14, 2017 (Year 2017).
Chen et al., High-T Polymer Dec. 25, 2017 (Year 2017).
Robin K. Huang, Bien Chann, James Burgess, Michael Kaiman, Robert Overman, John D. Glenn, and Parviz Tayebati "Direct diode lasers with comparable beam quality to fiber, CO2, and solid state lasers", Proc. SPIE 8241, High-Power Diode Laser Technology and Applications X, 824102 (Feb. 8, 2012); https://doi.org/10.1117/12.907161 (abstract only).
U.S. Appl. No. 11/829,030, filed Jul. 26, 2007.
U.S. Appl. No. 09/556,767, filed Apr. 24, 2020.
U.S. Appl. No. 09/170,491, filed Oct. 13, 1998.
U.S. Appl. No. 12/105,126, filed Apr. 17, 2008.
U.S. Appl. No. 12/648,141, filed Dec. 28, 2009.
U.S. Appl. No. 14/728,923, filed Jun. 2, 2015.
U.S. Appl. No. 15/167,748, filed May 27, 2016.
U.S. Appl. No. 15/363,874, filed Nov. 29, 2016.
U.S. Appl. No. 15/601,820, filed May 22, 2017.
U.S. Appl. No. 11/299,029, filed Dec. 9, 2005.
U.S. Appl. No. 16/539,889, filed Aug. 13, 2019.
U.S. Appl. No. 16/895,931, filed Jun. 8, 2020.
U.S. Appl. No. 16/540,961, filed Aug. 14, 2019.
U.S. Appl. No. 17/022,767, filed Sep. 16, 2020.
Official Action issued in corresponding U.S. Appl. No. 16/539,889, dated May 11, 2021, 21 pages.
International Preliminary Report on Patentability issued in International Application Serial No. PCT/US2019/046410, dated Feb. 16, 2021, 6 pages.
European Search Report issued in corresponding European Patent Application Serial No. EP 20 19 646.6, dated Feb. 16, 2021, 7 pages.
Office Action issued in U.S. Appl. No. 16/895,961, dated Dec. 10, 2021 (39 pgs).
Watson, Edward, Walter Whitaker, Christopher Brewer, and Scott Harris "Implementing Optical Phased Array Beam Steering with Cascaded Microlens Arrays" IEEE Proceedings, IEEE Aerospace Conference; Mar. 9-16, 2002 (Year: 2002).

\* cited by examiner

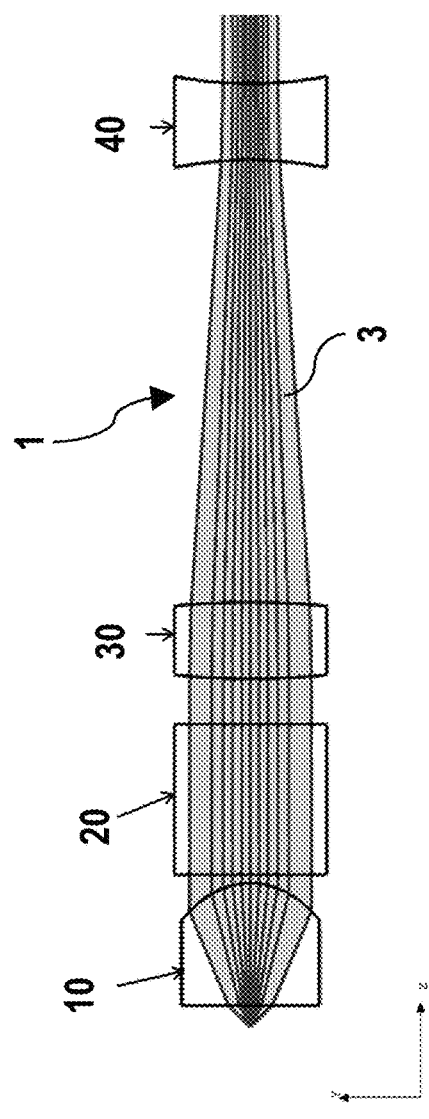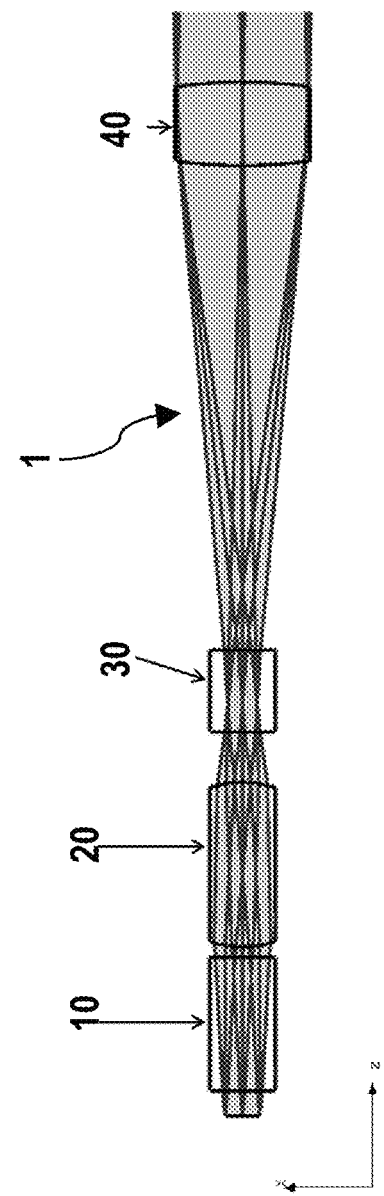
FIG.1A
FIG.1B

DIVERGENCE RESHAPING ARRAY

CROSS REFERENCE TO RELATED APPLICATION

This application claims benefit of U.S. Provisional Application Ser. No. 62/790,193 filed Jan. 9, 2019, titled "Divergence Reshaping Array," the entire disclosure of which is incorporated herein by reference.

FIELD OF THE DISCLOSURE

The present disclosure is generally related to laser diode collimation and more particularly is related to far field divergence reshaping.

BACKGROUND OF THE DISCLOSURE

Multimode laser diodes generally emit light that is highly asymmetric in horizontal directions (X and Y directions), leading to a beam with a fast axis and a slow axis. In the fast axis, the emission area is very small, but the angular divergence is large. Thus, the beam expands quickly in the direction of the fast axis. In the slow axis, the emission area is comparatively large, but the angular divergence is comparatively small. Thus, the beam expands slowly in the direction of the slow axis. The resultant beam is asymmetric across both axes. Even when the resultant beam is collimated, this results in an asymmetrical distribution at the far field.

Many applications of laser diodes require beams with low asymmetry. Traditionally, this leads to compromises in laser power or beam size to reach desired brightness. When laser diodes are arranged in an array, the array geometry may govern the collimation optics' ability to correct divergence. For example, where the vertical spacing, or bar to bar pitch, between laser diode bars is larger than optimal it may require the emitter to emitter pitch to decrease. This may result in the divergence in the fast axis being smaller than optimal and the slow axis being larger than optimal based on the constraints of the optical system.

Residual divergence is the extent of the angular distribution of light after passing through the collimating optics. For a typical slow axis collimating optic the residual divergence can be defined by the following equation:

$$\Theta_{residual} = 2\tan^{-1}\left(\frac{y}{2f}\right)$$

where $\Theta_{residual}$ is the residual divergence, y is the source width, and f is the focal length of a collimating lens.

For a laser diode bar, the minimum residual divergence may be achieved by maximizing the focal length of the collimating lens. Maximum focal length can be calculated using the following formula:

$$f_{max} = \frac{(p-y)}{2\tan\left(\frac{\Theta_{source}}{2}\right)}$$

where p is the emitter to emitter pitch and $\Theta_{source}$ is the divergence of the source.

For common laser diode array collimation, the maximum focal length to minimize, divergence is the distance from the source to the location of where the largest angle rays from adjacent emitters intersect. A laser diode array may consist of a number of laser diode bars stacked vertically. The bar-to-bar pitch, which is the height between vertically adjacent diodes, is generally based on factors such as thermal dissipation and optical beam size. The slow axis emitter pitch may be smaller than ideal for a given power level resulting in lower than ideal brightness in the slow axis.

Thus, a heretofore unaddressed need exists in the industry to address the aforementioned deficiencies and inadequacies.

SUMMARY OF THE DISCLOSURE

Embodiments of the present disclosure provide a divergence reshaping apparatus for laser diodes having a fast axis and a slow axis. Briefly described, in architecture, one embodiment of the apparatus, among others, can be implemented as follows. A divergence reshaping apparatus for laser diodes having a fast axis and a slow axis includes a fast axis collimator element having positive optical power in the fast axis and no optical power in the slow axis. A slow axis magnifier element has no optical power in the fast axis and positive optical power in the slow axis. An objective element has positive optical power in the fast axis and no optical power in the slow axis. A slow axis collimator element has negative optical power in the fast axis and positive optical power in the slow axis. Every element is optically aligned down an optical axis, and wherein a beam travelling through every element is collimated, compressed and shifted in the fast axis and expanded and collimated in the slow axis.

In one aspect of the disclosure, the fast axis collimator element has a plano-convex shape in the fast axis; the slow axis magnifier element has a convex shape in the slow axis; the objective element has a convex shape in the fast axis; and the slow axis collimator element has a concave shape in the fast axis and a convex shape in the slow axis.

In another aspect of the disclosure, the objective element is an off-axis objective element aligned to shift the beam in the fast axis.

In yet another aspect of the disclosure, the off-axis objective element has sectional radii of curvature, and the off-axis objective element preferably is a single element having a plurality of radii of curvature, or the off-axis objective element is a plurality of objective elements each having an individual radius of curvature.

In still yet another aspect of the disclosure, the laser diodes operate in at least one chosen from the set of: the visible and the infrared portion of the electromagnetic spectrum.

The present disclosure can also be viewed as providing methods of reshaping a laser beam along a fast and slow axis. In this regard, one embodiment of such a method, among others, can be broadly summarized by the following steps: generating a laser beam from a laser diode; collimating the laser beam along a fast axis using a fast axis collimator element having positive optical power in the fast axis and no optical power in the slow axis; magnifying laser beam along the slow axis using a slow axis magnifier element having no optical power in the fast axis and positive optical power in the slow axis; compressing the laser beam along the fast axis using an objective element having positive optical power in the fast axis and no optical power in the slow axis; and collimating the laser beam along the slow axis and compressing the laser beam along the fast axis using a slow axis collimator element having negative optical power in the fast axis and positive optical power in the slow axis.

In one aspect of the method, the fast axis collimator element has a plano-convex shape in the fast axis; the slow axis magnifier element has a convex shape in the slow axis; the objective element has a convex shape in the fast axis; and the slow axis collimator element has a concave shape in the fast axis and a convex shape in the slow axis.

In another aspect of the method, the objective element is an off-axis objective element aligned to shift the beam in the fast axis, the off-axis objective element preferably has sectional radii of curvature, and the off-axis objective element preferably is a single element having a plurality of radii of curvature, the off-axis objective element preferably is a plurality of objective elements each having an individual radius of curvature, and/or the laser diodes operate in at least one chosen from the set of: the visible and the infrared portion of the electromagnetic spectrum.

The present disclosure can also be viewed as providing a divergence reshaping array. Briefly described, in architecture, one embodiment of the array, among others, can be implemented as follows. A divergence reshaping array for an array of laser diodes having a fast axis and a slow axis includes an array of divergence reshaping apparatuses corresponding to the array of laser diodes. Each divergence reshaping apparatus includes a fast axis collimator element has positive optical power in the fast axis and no optical power in the slow axis. A slow axis magnifier element has no optical power in the fast axis and positive optical power in the slow axis. An off-axis objective element has positive optical power in the fast axis and no optical power in the slow axis, the off-axis objective element aligned to shift a laser beam in the fast axis. A slow axis collimator element has negative optical power in the fast axis and positive optical power in the slow axis. Every element is optically aligned down an optical axis. The laser beam travelling through every element is collimated, compressed and shifted in the fast axis and expanded and collimated in the slow axis.

In one aspect of the array the fast axis collimator element has a plano-convex shape in the fast axis; the slow axis magnifier element has a convex shape in the slow axis; the objective element has a convex shape in the fast axis; and the slow axis collimator element has a concave shape in the fast axis and a convex shape in the slow axis.

In another aspect of the array, the off-axis objective element has sectional radii of curvature, the off-axis objective element preferably is a single element having a plurality of radii of curvature, or the off-axis objective element is a plurality of objective elements each having an individual radius of curvature.

In still another aspect of the array laterally adjacent off-axis objective elements are aligned to alternatingly shift corresponding laterally adjacent beams in a positive direction off of the fast axis and a negative direction off of the fast axis.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 1A is an illustration of the divergence reshaping apparatus showing the fast axis, in accordance with a first exemplary embodiment of the present disclosure.

FIG. 1B is an illustration of the divergence reshaping apparatus showing the slow axis, in accordance with the first exemplary embodiment of the present disclosure.

DETAILED DESCRIPTION

Figure 2:
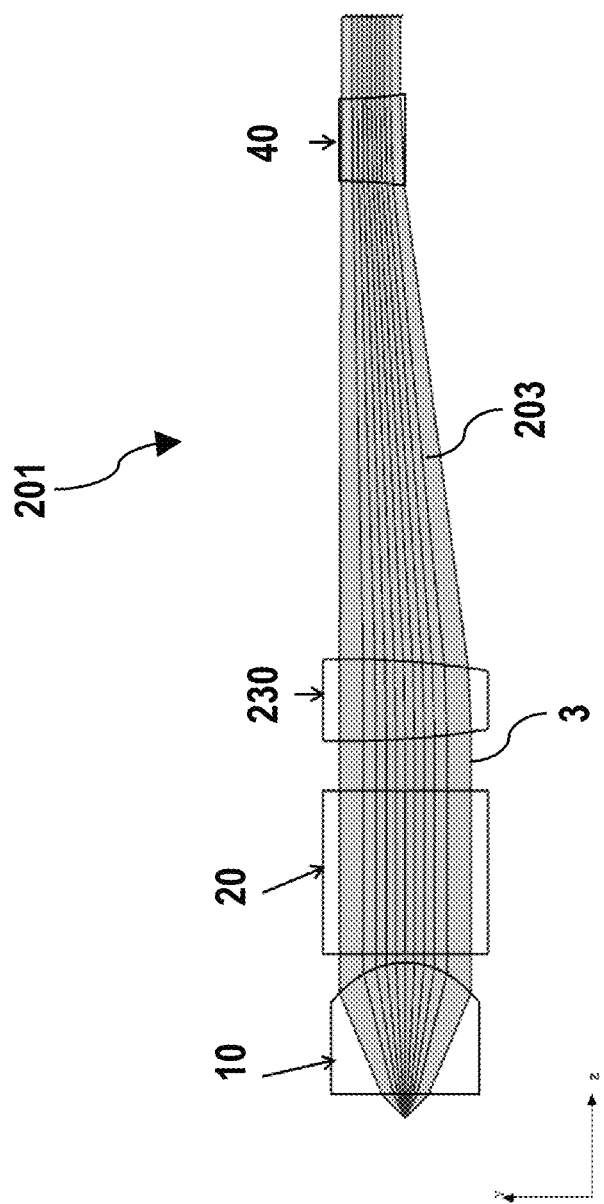
FIG. 2 is an illustration of the divergence reshaping apparatus showing a beam shift along the fast axis, in accordance with the first exemplary embodiment of the present disclosure.

The present disclosure describes an optical system and apparatus for collimating one or more laser diode beams while reshaping the beams on the fast and slow axes to minimize the residual slow axis divergence of the beams. In one example, the optical system and apparatus may reduce slow axis residual divergence, increasing fast axis residual divergence according to the inverse of the change in the slow axis residual divergence.

To achieve higher slow axis brightness than typical slow axis collimation provides, the divergence reshaping apparatus trades off fast axis brightness for increased slow axis brightness. For the divergence reshaping apparatus, in the fast axis, each beam from an emitter on a laser diode bar is collimated, compressed and is shifted vertically, forming multiple rows from each bar. In the slow axis, each beam from an emitter passes through a slow axis magnification optic before the beam expands to the emitter pitch allowing for the use of high fill factor laser diode bars. Fill factor may be the amount of emission width divided by the length of the bar. For example, if the bar is 10 mm wide with 50 emitters of 0.1 mm length on a 0.2 mm pitch, the fill factor would be 50%. Each beam continues and expands to a width larger than the emitter pitch where it is then collimated by the slow axis collimator. Because the design conserves étendue and the beam from each emitter in the slow axis direction is able to expand mom than the emitter to emitter pitch, the beam in the slow axis becomes brighter than what is achievable with typical slow axis collimation.

The fast axis and slow axis refer to two orthogonal axes which are both orthogonal to the direction of propagation of the laser beam and the optical axis. For the purposes of the present disclosure, the slow axis will be illustrated using an x-axis, the fast axis will be illustrated using a y-axis, and the direction of propagation using a z-axis. In general, the x-axis is a horizontal axis, the y-axis is a vertical axis, and the z-axis is a lateral axis.

FIG. 1A is an illustration of the divergence reshaping apparatus 1 (hereinafter, "reshaping apparatus 1") showing the fast axis, in accordance with a first exemplary embodiment of the present disclosure. The reshaping apparatus 1 includes a fast axis collimator element 10 having positive optical power in the fast axis and no optical power in the slow axis. A slow axis magnifier element 20 has no optical power in the fast axis and positive optical power in the slow axis. An objective element 30 has positive optical power in the fast axis and no optical power in the slow axis. A slow axis collimator element 40 has negative optical power in the fast axis and positive optical power in the slow axis. Every element 10, 20, 30, 40 is optically aligned down an optical axis, and a beam 3 travelling through every element is compressed in the fast axis and expanded in the slow axis. FIG. 1B is an illustration of the reshaping apparatus 1 showing the slow axis.

The reshaping apparatus 1 may include any suitable size, number, and shape of optical elements therein. For instance, the optical elements described above may be planar, spherical, aspheric, such as parabolic, elliptical, and hyperbolic, or any combination thereof. In one example, the reshaping apparatus 1 may include a fast axis collimator element 10 having a plano-convex shape in the fast axis and a planar shape in the slow axis. The slow axis magnifier element 20 may have a planar shape in the fast axis and a convex shape in the slow axis. The objective element 30 may have a convex shape in the fast axis and a planar shape in the slow axis. The slow axis collimator element 40 may have a concave shape in the fast axis and a convex shape in the slow axis.

The elements 10, 20, 30, 40 may be any optically transmissive and refractive elements, depending on the design and the lasers in use with the apparatus. For instance, the elements 10-40 may be made from glass, plastic, birefringent materials, optically-doped materials, refraction gratings, polarized materials, and the like. In one example, the elements 10-40 may be glass or plastic lenses having high transmissivity in the visible and infrared ranges. The radius of curvature, thickness, spacing, and alignment of each element 10, 20, 30, 40 may be dependent on the laser diode source (not shown) and the source size.

The fast axis collimator element 10 is shown having positive optical power in the fast axis, and no optical power in the slow axis. The fast axis collimator element 10 may work to expand and collimate the beam 3 in the fast axis only, while leaving the beam 3 in the slow axis otherwise unaffected. The slow axis magnifier element 20 has no optical power in the fast axis and a positive optical power in the slow axis. FIG. 1B shows the positive optical power of the slow axis magnifier element 20. The slow axis magnifier element 20 magnifies the beam 3 along the slow axis, while leaving the beam 3 otherwise unaffected in the fast axis. The objective element 30 has positive optical power in the fast axis and no optical power in the slow axis. FIG. 1A shows the positive optical power of the objective element 30. The objective element 30 may be a Galilean objective, and may direct the beam 3 along the direction of propagation. The slow axis collimator element 40 has negative optical power in the fast axis and positive optical power in the slow axis. FIG. 1A shows the slow axis collimator element 40 in the fast axis. With its concave shape, it acts as a Galilean telescope eyepiece, and together with the objective element 30 compresses the beam 3 in the fast axis direction. FIG. 1B shows the slow axis collimator element 40 in the slow axis direction. The slow axis magnifier element 20 expands the beam 3 in the slow axis direction, and the slow axis collimator element 40 collimates the incident beam 3 to reduce divergence. With the beam 3 collimated in both slow and fast axes, slow axis residual divergence is reduced, and the beam shows increased symmetry while conserving étendue.

FIG. 2 is an illustration of the divergence reshaping apparatus 201 showing a beam shift along the fast axis, in accordance with the first exemplary embodiment of the present disclosure. In the example illustrated in FIG. 2, the divergence reshaping apparatus 201 may include the lens elements shown in FIGS. 1A-1B, including the fast axis collimator 10, slow axis magnifier element 20, and slow axis collimator element 40. Additionally, the objective element 30 may be an off-axis objective element 230, which may shift the beam 3 in the fast axis. The slow axis collimator element 40 may be aligned off-axis in the fast axis so as to properly collimate the shifted beam 203.

Figure 3A:
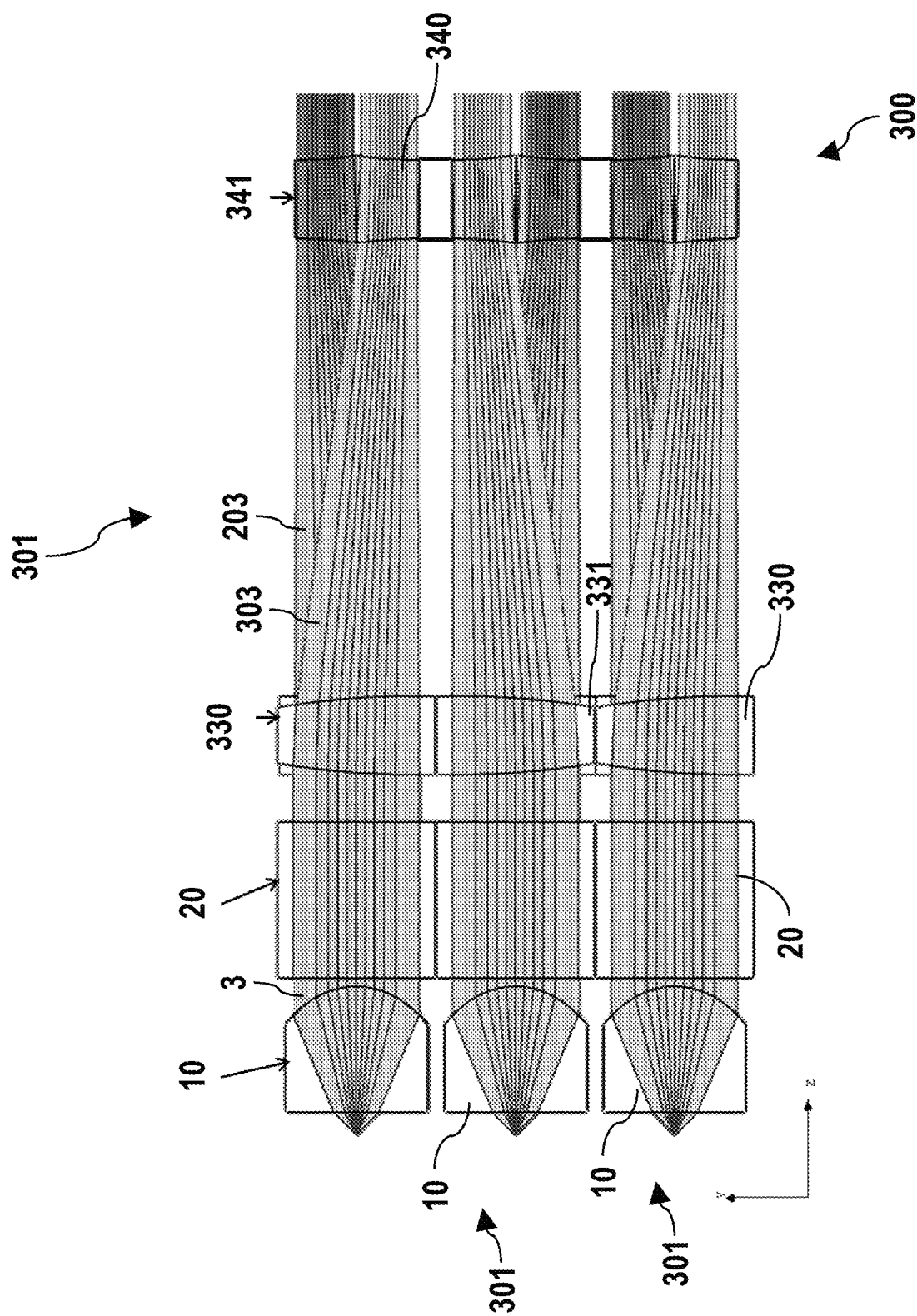
FIG. 3A is an illustration of an array of divergence reshaping apparatuses showing the fast axis, in accordance with a second exemplary embodiment of the present disclosure.

FIG. 3A is an illustration of an array 300 of divergence reshaping apparatuses 301 showing the fast axis, in accordance with a second exemplary embodiment of the present disclosure. The array 300 may be used together with a vertically stacked series of laser diode bars (not shown). The diode bars may have a number of laser diodes lined up behind one another along the slow axis (x-axis). The beams 3 from these laser diodes may be similarly aligned, and may be shifted by the apparatuses in the fast axis. The divergence reshaping apparatuses 301 may each include a fast axis collimator element 10 and slow axis magnifier element 20. The beams 3 may be collimated in the fast axis as in FIG. 1A, above. An off-axis objective element 330, 331 may shift the beams 3 in a negative or positive direction, respectively, off of the fast axis. In other words, one beam 303 in the array may be shifted down on the fast axis and compressed by an off-axis objective element 330 and an off-axis slow axis collimator element 340. An adjacent beam 203 may be shifted up on the fast axis and compressed by an off-axis objective element 331 and an off-axis slow axis collimator element 341. Thus, the laterally adjacent beams 203, 303 passing through the laterally adjacent off-axis elements 330, 331 may be shifted in alternating positive and negative directions relative to the fast axis. The off-axis objective elements 330, 331 may be aligned to shift the beams 303, 203 positively or negatively on the fast axis. The off-axis slow axis collimator elements 340, 341 may be located and aligned to allow the shifted beams 303, 203 to propagate through and remain collimated.

Figure 3B:
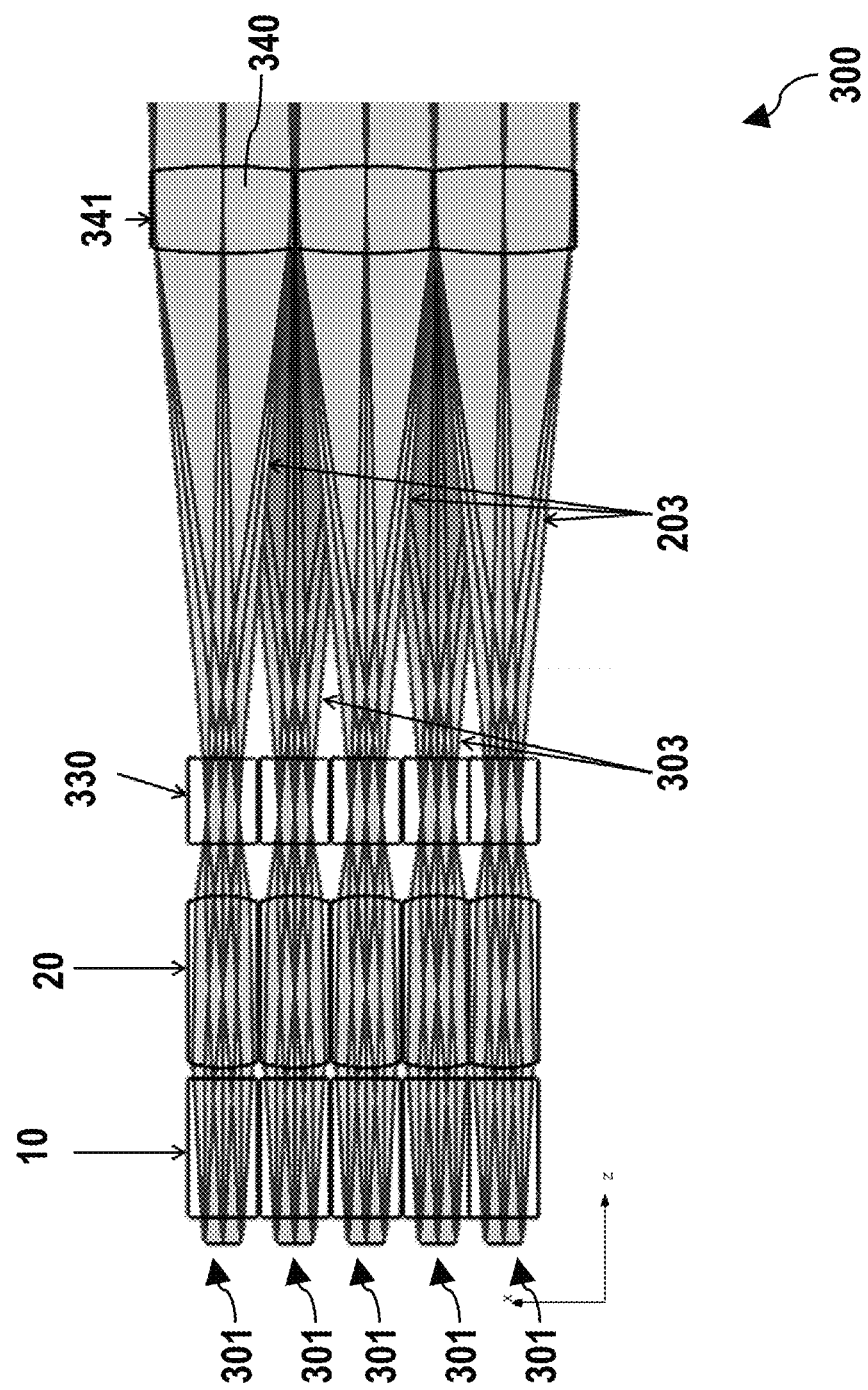
FIG. 3B is an illustration of an array of divergence reshaping apparatuses showing the slow axis, in accordance with the second exemplary embodiment of the present disclosure.

FIG. 3B is an illustration of the array 300 of divergence reshaping apparatuses 301 showing the slow axis, in accordance with the second exemplary embodiment of the present disclosure. FIG. 3B shows the array 300 of FIG. 3A from an orthogonal viewpoint, with special interest to the lens elements affecting the slow axis. FIG. 3B shows the reshaping apparatuses 301 in a horizontal line to accommodate the shape of the laser diode bar in the horizontal direction. Beams passing through the divergence reshaping apparatuses 301 are expanded as discussed relative to FIG. 1A, above, and are beam-shifted off of the fast axis to beams 303, 203, as discussed relative to FIG. 3A, above.

Figure 4A:
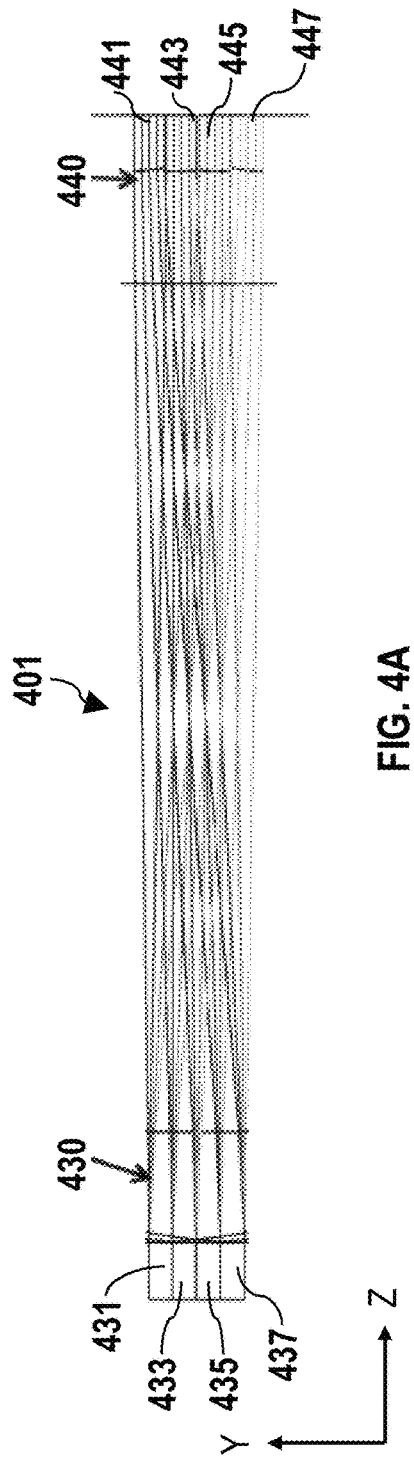
FIG. 4A is an illustration of a divergence reshaping apparatus showing sectional beam shifting in the fast axis, in accordance with the second exemplary embodiment of the present disclosure.
Figure 4B:
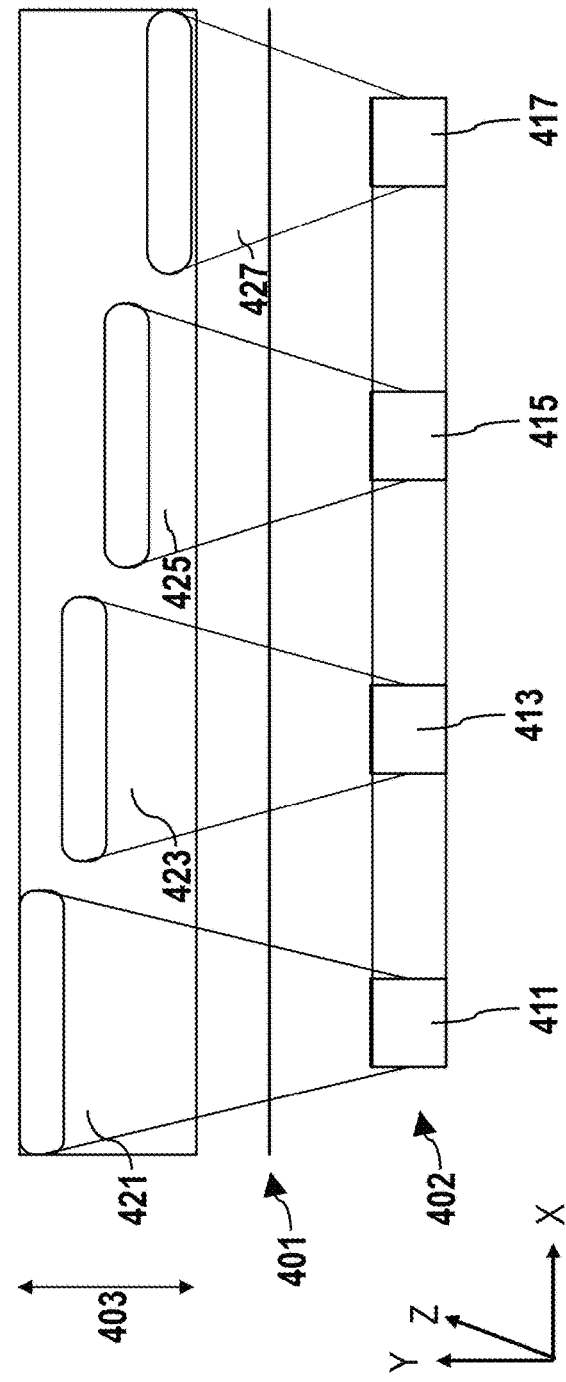
FIG. 4B is a diagrammatical illustration of the effect of divergence reshaping apparatus 401 on light emitted by the diode bar 402, in accordance with the second exemplary embodiment of the present disclosure.

FIGS. 4A-4B show a divergence reshaping apparatus 401 in use with a diode bar 402 having four diodes 411, 413, 415, 417. As shown, diode bar 402 may have four diodes 411, 413, 415, 417 and corresponding sections of objective elements 430 and slow axis collimator elements 440. However, this illustration is exemplary only; any number and configuration of diodes and corresponding elements may be considered within the scope of this disclosure.

FIG. 4A is an illustration of a divergence reshaping apparatus 401 showing sectional beam shifting in the fast axis, in accordance with the second exemplary embodiment of the present disclosure. Sectional beam shifting in the fast axis may be accomplished by shifting each individual beam from each source along the fast axis to a different degree. The apparatus 401 may include each of the elements shown relative to FIGS. 1A-3B, above, including the fast axis collimator 10, slow axis magnifier element 20, objective element 30, and slow axis collimator element 40. However, for ease of viewing in the illustration, the fast axis collimator 10 and slow axis magnifier element 20 are not shown. The Galilean telescope elements 430 and 440 may, for each diode, have different radii of curvature to allow the objective elements 430 and slow axis collimator elements 440 to shift vertical sections of the beams to achieve a more even beam distribution in the fast axis direction. For instance, objective element 430 may be a number of separate, sectional objective elements 431, 433, 435, 437. Each element may have a different radius of curvature and may be shaped and located to direct a particular beam from a particular diode. Objective element 430 may be manufactured as a single element with multiple radii of curvature representing each of the sectional elements 431, 433, 435, 437. In another example, objective element 430 may comprise a number of individual sectional elements. Depending on the design and implementation of the apparatus 401, the objective element 430 may have any number of sectional elements. The sectional elements 431, 433, 435, 437 separate the beams into a corresponding number of beam sections distributed off of the fast axis. The slow axis collimator elements 440 may also include a number of sectional collimator elements 441, 443, 445, 447 with different radii of curvature for directing the beam sections along the optical axis. The slow axis collimator element 440 may be manufactured similar to the objective elements 430 above, and may include a like number of sectional elements depending on the design. The beam sections propagating through the slow axis collimator element 440 may be evenly distributed and highly symmetrical along the fast axis.

FIG. 4B is a diagrammatical illustration of the effect of divergence reshaping apparatus 401 on light emitted by the diode bar 402, in accordance with the second exemplary embodiment of the present disclosure. Divergence reshaping apparatus 401 is shown as a line for ease of illustration. The apparatus 401 may include any of the elements described relative to FIGS. 1-4A, above. Diodes 411, 413, 415, 417 within diode bar 402 may each emit a beam 421, 423, 425, 427, respectively, that propagates through the divergence reshaping apparatus 401. Each beam 421, 423, 425, 427 may be shifted along the fast axis by the objective elements 431, 433, 435, 437, and collimated by the slow axis collimator elements 441, 443, 445, 447, as shown in FIG. 4A. Each beam 421, 423, 425, 427 may be shifted by a different amount-positive or negative-along the fast axis. For example, beam 421 may be shifted vertically along the fast axis a greater distance than beam 423. Beam 427 may be shifted vertically along the fast axis in the negative direction a greater distance than beam 425. In one example, each beam 421, 423, 425, 427 may be shifted to evenly distribute a length 403 along the fast axis. In another example, at least one beam may be shifted in a different direction and to a different extent than another beam. In another example, at least one beam may be shifted in the same direction and to the same extent as another beam.

Figure 5:
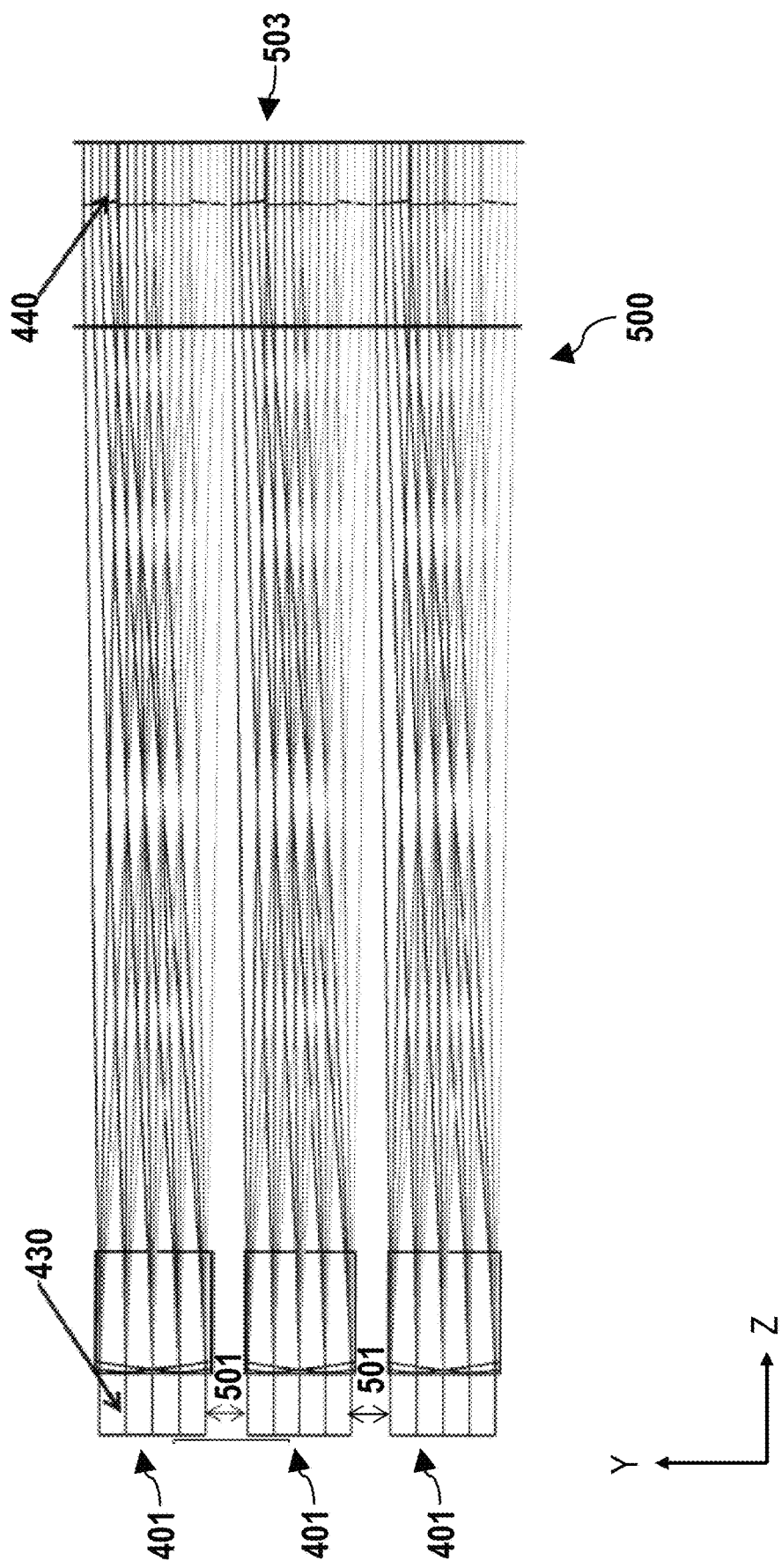
FIG. 5 is an illustration of an array of divergence reshaping apparatuses showing sectional beam shifting in the fast axis, in accordance with the second exemplary embodiment of the present disclosure.

FIG. 5 is an illustration of an array 500 of divergence reshaping apparatuses 401 showing sectional beam shifting in the fast axis, in accordance with the second exemplary embodiment of the present disclosure. In the array 500, a number of divergence reshaping apparatuses 401 may be aligned, both vertically and horizontally, to achieve the desired far field beam. FIG. 5 shows a vertical array of three reshaping apparatuses 401 separated by a vertical pitch 501. The vertical pitch 501 may be determined by the fast axis distribution of the shifted beams 421, 423, 425, 427 propagated through each reshaping apparatus 401, as discussed relative to FIGS. 4A-4B, above. Galilean telescope dements, objective elements 430 and slow axis collimator dements 440, may be located and shaped to distribute each beam along the fast axis by sections. The resultant beam 503 may be evenly distributed along the fast axis, with little residual divergence. When the fast axis collimator elements 10 and slow axis magnifier elements 20 are used, the beams are symmetrically distributed about both axes and show little residual divergence.

The bars and arrays of laser diodes and corresponding divergence reshaping apparatuses may include any number of elements, including any number of rows and columns. The bars and arrays may be any suitable shape and configuration for achieving a far field laser beam of desired size, shape, and intensity distribution.

Figure 6:
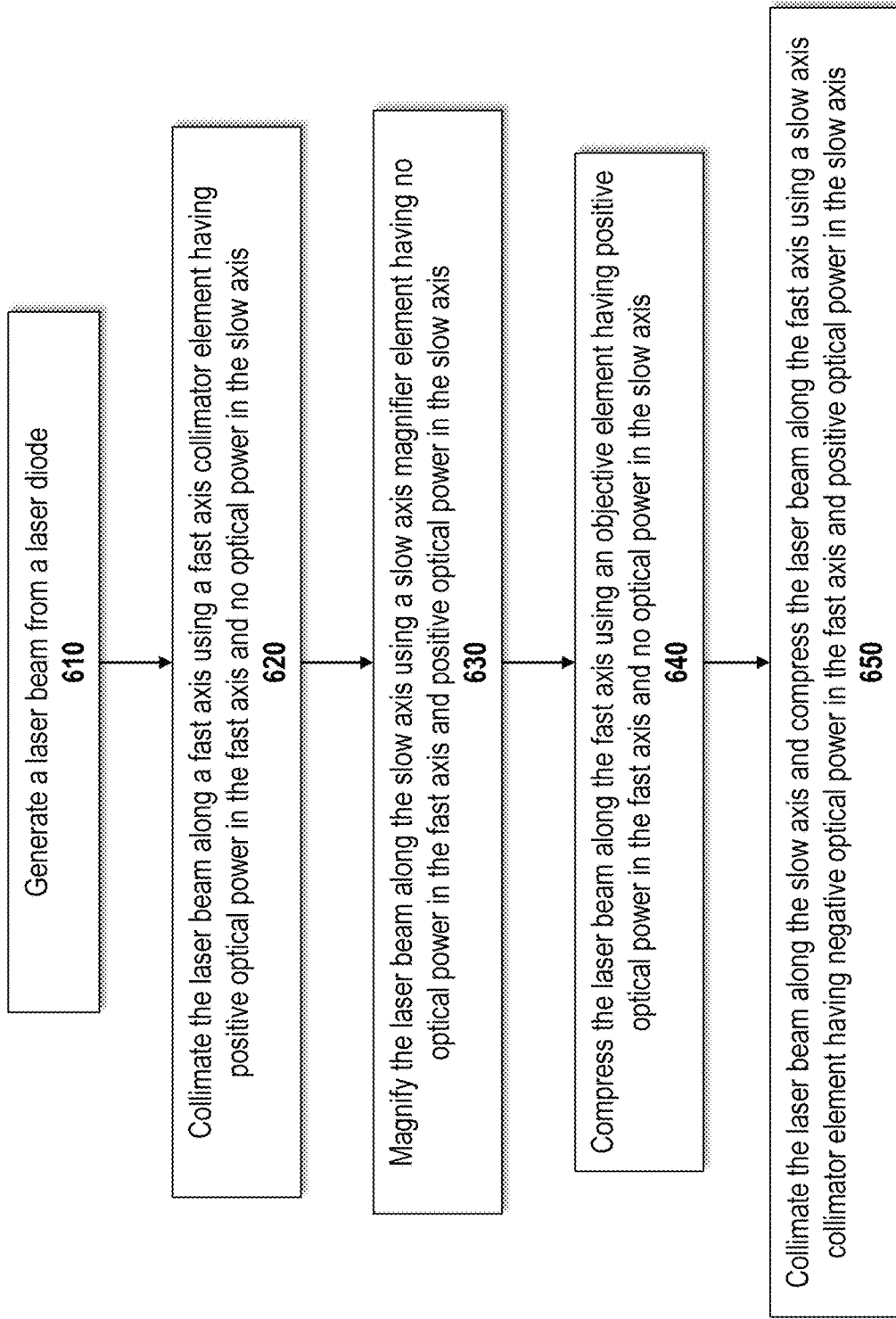
FIG. 6 is a flow chart illustrating a method of reshaping a laser beam along a fast and slow axis, in accordance with the first exemplary embodiment of the present disclosure.

FIG. 6 is a flow chart 600 illustrating a method of reshaping a laser beam along a slow axis, in accordance with the first exemplary embodiment of the present disclosure. It should be noted that any process descriptions or blocks in flow charts should be understood as representing modules, segments, or steps that include one or more instructions for implementing specific logical functions in the process, and alternate implementations are included within the scope of the present disclosure in which functions may be executed out of order from that shown or discussed, including substantially concurrently or in reverse order, depending on the functionality involved, as would be understood by those reasonably skilled in the art of the present disclosure.

Step 610 includes generating a laser beam from a laser diode.

Step 620 includes collimating the laser beam along a fast axis using a fast axis collimator element having positive optical power in the fast axis and no optical power in the slow axis.

Step 630 includes magnifying the laser beam along the slow axis using a slow axis magnifier element having no optical power in the fast axis and positive optical power in the slow axis.

Step 640 includes compressing the laser beam along the fast axis using an objective element having positive optical power in the fast axis and no optical power in the slow axis.

Step 650 includes collimating the laser beam along the slow axis and compressing the laser beam along the fast axis using a slow axis collimator element having negative optical power in the fast axis and positive optical power in the slow axis.

The method may further include any other features, components, or functions disclosed relative to any other figure of this disclosure.

It should be emphasized that the above-described embodiments of the present disclosure, particularly, any "preferred" embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A divergence reshaping apparatus for laser diodes having a fast axis and a slow axis, comprising:
    a fast axis collimator element having positive optical power in the fast axis and no optical power in the slow axis;
    a slow axis magnifier element having no optical power in the fast axis and positive optical power in the slow axis;
    an objective element having positive optical power in the fast axis and no optical power in the slow axis; and
    a slow axis collimator element having negative optical power in the fast axis and positive optical power in the slow axis,
    wherein every element is optically aligned down an optical axis, and wherein a beam travelling through every element is collimated, compressed and shifted in the fast axis and expanded and collimated in the slow axis.

2. The apparatus of claim 1 wherein:
    the fast axis collimator element has a plano-convex shape in the fast axis;
    the slow axis magnifier element has a convex shape in the slow axis;
    the objective element has a convex shape in the fast axis; and
    the slow axis collimator element has a concave shape in the fast axis and a convex shape in the slow axis.

3. The apparatus of claim 1, wherein the objective element is an off-axis objective element aligned to shift the beam in the fast axis.

4. The apparatus of claim 1, wherein the laser diodes operate in at least one chosen from the set of: the visible and the infrared portion of the electromagnetic spectrum.

5. A method of reshaping a laser beam along a fast and slow axis, comprising the steps of:
    generating a laser beam from a laser diode;
    collimating the laser beam along a fast axis using a fast axis collimator element having positive optical power in the fast axis and no optical power in the slow axis;
    magnifying the laser beam along the slow axis using a slow axis magnifier element having no optical power in the fast axis and positive optical power in the slow axis;
    compressing the laser beam along the fast axis using an objective element having positive optical power in the fast axis and no optical power in the slow axis; and
    collimating the laser beam along the slow axis and compressing the laser beam along the fast axis using a slow axis collimator element having negative optical power in the fast axis and positive optical power in the slow axis.

6. The method of claim 5, wherein:
    the fast axis collimator element has a plano-convex shape in the fast axis;
    the slow axis magnifier element has a convex shape in the slow axis;
    the objective element has a convex shape in the fast axis; and
    the slow axis collimator element has a concave shape in the fast axis and a convex shape in the slow axis.

7. The method of claim 5, wherein the objective element is an off-axis objective element aligned to shift the beam in the fast axis.

8. The method of claim 5, wherein the laser diodes operate in at least one chosen from the set of the visible and the infrared portion of the electromagnetic spectrum.

9. A divergence reshaping array for an array of laser diodes having a fast axis and a slow axis, comprising:
    an array of divergence reshaping apparatuses corresponding to the array of laser diodes,
    each divergence reshaping apparatus comprising:
        a fast axis collimator element having positive optical power in the fast axis and no optical power in the slow axis;
        a slow axis magnifier element having no optical power in the fast axis and positive optical power in the slow axis;
        an off-axis objective element having positive optical power in the fast axis and no optical power in the slow axis, the off-axis objective element aligned to shift a laser beam in the fast axis; and
        a slow axis collimator element having negative optical power in the fast axis and positive optical power in the slow axis,
    wherein every element is optically aligned down an optical axis, and wherein the laser beam travelling through every element is collimated, compressed and shifted in the fast axis and expanded and collimated in the slow axis.

10. The array of claim 9, wherein:
    the fast axis collimator element has a plano-convex shape in the fast axis;
    the slow axis magnifier element has a convex shape in the slow axis;
    the objective element has a convex shape in the fast axis; and
    the slow axis collimator element has a concave shape in the fast axis and a convex shape in the slow axis.

11. The array of claim 9, wherein all of the off-axis objective elements are formed as a single element.

12. The array of claim 9, wherein at least one off-axis objective element shifts a corresponding laser beam to a different position along the fast axis than the other off-axis objective elements.

13. The array of claim 12, wherein each beam is shifted to evenly distribute a length along the fast axis.

14. The array of claim 12, wherein each of a plurality of divergence reshaping apparatuses corresponding to an array of laser diodes is separated by a vertical pitch, and wherein each beam is shifted to evenly distribute across the vertical pitch.

15. The array of claim 12, wherein all of the off-axis objective elements are formed as a single element having a plurality of radii of curvature.

16. The array of claim 12, wherein the at least one off-axis objective element has a different radius of curvature than the other off-axis objective elements.

17. The array of claim 12, wherein each off-axis objective element has an individual radius of curvature.

18. The array of claim 12, wherein laterally adjacent off-axis objective elements are aligned to alternatingly shift corresponding laterally adjacent beams in a positive direction off of the fast axis and a negative direction off of the fast axis.

19. The array of claim 9, wherein the laser diodes operate in at least one chosen from the set of: the visible and the infrared portion of the electromagnetic spectrum.

20. The array of claim 9, wherein all of the slow axis collimator elements are formed as a single element.

* * * * *